(12) United States Patent
Mieda (10) Patent No.: US 10,829,670 B2
(45) Date of Patent: Nov. 10, 2020

(54) CURABLE AND HYGROSCOPIC RESIN COMPOSITION FOR SEALING ELECTRONIC DEVICES, RESIN CURED MATERIAL, AND ELECTRONIC DEVICE

(71) Applicant: FURUKAWA ELECTRIC CO., LTD., Tokyo (JP)

(72) Inventor: Tetsuya Mieda, Tokyo (JP)

(73) Assignee: FURUKAWA ELECTRIC CO., LTD., Tokyo (JP)

( * ) Notice: Subject to any disclaimer, the term of this patent is extended or adjusted under 35 U.S.C. 154(b) by 198 days.

(21) Appl. No.: 15/875,792

(22) Filed: Jan. 19, 2018

(65) Prior Publication Data
US 2018/0208805 A1 Jul. 26, 2018

Related U.S. Application Data

(63) Continuation of application No. PCT/JP2016/069814, filed on Jul. 4, 2016.

(30) Foreign Application Priority Data

Jul. 21, 2015 (JP) ................................. 2015-143814

(51) Int. Cl.
*C09J 11/06* (2006.01)
*C09J 135/02* (2006.01)
(Continued)

(52) U.S. Cl.
CPC ............... *C09J 11/06* (2013.01); *C08F 2/44* (2013.01); *C08F 2/48* (2013.01); *C09J 4/00* (2013.01);
(Continued)

(58) Field of Classification Search
None
See application file for complete search history.

(56) References Cited

U.S. PATENT DOCUMENTS 6,169,152 B1* 1/2001 Sakai ................. C08F 10/00
  502/117
6,747,085 B2* 6/2004 Sone ................. C08C 19/00
  524/269

(Continued)

FOREIGN PATENT DOCUMENTS

CN  103509383 A  1/2014
JP  2004-231938 A  8/2004
(Continued)

OTHER PUBLICATIONS

International Search Report for PCT/JP2016/069814 (PCT/ISA/210) dated Sep. 27, 2016.
(Continued)

*Primary Examiner* — Joseph D Anthony
(74) *Attorney, Agent, or Firm* — Birch, Stewart, Kolasch & Birch, LLP

(57) ABSTRACT

A curable and hygroscopic resin composition for sealing electronic devices, comprising: a radically polymerizable compound (a); a hygroscopic compound (b) containing a structure represented by Formula (1); and a photo-radical polymerization initiator (c); a resin cured material formed by curing the composition, and an electronic device sealed by curing the composition.

Formula (1)

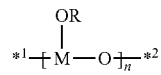

wherein in Formula (1), R designates (i) an acyl group, (ii) a hydrocarbon group, or (iii) a group having at least one selected from the group consisting of —O—, —S—, —CO—, and —NH—, between a carbon-carbon bond
(Continued)

of the above-described hydrocarbon group; M designates a boron or aluminum atom; n is an integer of 2 to 20; and *1 and *2 each designate a binding site to a terminal group or are bonded to each other.

12 Claims, 2 Drawing Sheets

(51) Int. Cl.
| | |
|---|---|
| C09J 133/08 | (2006.01) |
| C09J 125/02 | (2006.01) |
| C08F 2/48 | (2006.01) |
| C08F 2/44 | (2006.01) |
| H01L 23/29 | (2006.01) |
| H01L 23/16 | (2006.01) |
| H01L 51/44 | (2006.01) |
| H01L 23/31 | (2006.01) |
| C09J 4/00 | (2006.01) |
| H01L 51/00 | (2006.01) |
| H01L 51/52 | (2006.01) |

(52) U.S. Cl.
CPC ........... *C09J 125/02* (2013.01); *C09J 133/08* (2013.01); *C09J 135/02* (2013.01); *H01L 23/16* (2013.01); *H01L 23/293* (2013.01); *H01L 23/3135* (2013.01); *H01L 51/004* (2013.01); *H01L 51/0035* (2013.01); *H01L 51/0043* (2013.01); *H01L 51/448* (2013.01); *H01L 51/5246* (2013.01); *H01L 23/3121* (2013.01)

(56) References Cited

U.S. PATENT DOCUMENTS 7,067,196 B2 * 6/2006 Pradel .................... B32B 27/32
 428/516

| | | | |
|---|---|---|---|
| 2003/0065083 A1* | 4/2003 | Sone ....................... | C08C 19/00 524/492 |
| 2005/0227114 A1* | 10/2005 | Tanaka ................... | B01J 20/223 428/690 |
| 2009/0045729 A1* | 2/2009 | Fujita .................... | C08F 220/28 313/504 |
| 2016/0020423 A1* | 1/2016 | Saito ..................... | C08K 5/0091 257/40 |
| 2016/0362587 A1* | 12/2016 | Aoyama ............... | C08F 299/00 |
| 2017/0047548 A1 | 2/2017 | Mieda et al. | |

FOREIGN PATENT DOCUMENTS

| | | |
|---|---|---|
| JP | 2005-298598 A | 10/2005 |
| JP | 2007-191511 A | 8/2007 |
| JP | 2010-111743 A | 5/2010 |
| JP | 2010-132801 A | 6/2010 |
| JP | 2013-108057 A | 6/2013 |
| JP | 2014-140797 A | 8/2014 |
| JP | 5764687 B1 | 8/2015 |
| JP | 2015-162415 A | 9/2015 |
| JP | 2015-197969 A | 11/2015 |
| JP | 5836536 B1 | 12/2015 |
| WO | WO 2014/156593 A1 | 10/2014 |
| WO | WO 2015/129416 A1 | 9/2015 |
| WO | WO 2015/152053 A1 | 10/2015 |

OTHER PUBLICATIONS

Japanese Office Action issued in JP Patent Application No. 2015-143814 dated Mar. 15, 2016.
Japanese Office Action issued in JP Patent Application No. 215-143814 dated Aug. 2, 2016.
Written Opinion of the International Searching Authority for PCT/JP2016/069814 (PCT/ISA/237) dated Sep. 27, 2016.
Chinese Office Action and Search Report, dated Apr. 8, 2019, for corresponding Chinese Application No. 201680006948.5, with an English translation of the Chinese Office Action.

* cited by examiner

CURABLE AND HYGROSCOPIC RESIN COMPOSITION FOR SEALING ELECTRONIC DEVICES, RESIN CURED MATERIAL, AND ELECTRONIC DEVICE

CROSS-REFERENCE TO RELATED APPLICATIONS

This application is a Continuation of PCT International Application No. PCT/JP2016/069814 filed on Jul. 4, 2016, which claims priority under 35 U.S.C. § 119 (a) to Japanese Patent Application No. 2015-143814 filed in Japan on Jul. 21, 2015. Each of the above applications is hereby expressly incorporated by reference, in its entirety, into the present application.

TECHNICAL FIELD

The present invention relates to a curable and hygroscopic resin composition for sealing electronic devices, which is capable of forming a resin cured material providing a high sealing property, a resin cured material, and electronic devices sealed with this resin cured material. In particular, the present invention relates to a sealing of constituent members of the electronic devices, such as an organic electronic device, an organic light-emitting element (organic EL element), a touch panel, a light-emitting diode (LED), and a solar cell.

BACKGROUND ART

The organic light-emitting element, which is one example of electronic devices, has a problem with a gradual deterioration of the emission properties, such as emission brightness and emission efficiency, caused by the use thereof. Examples of the causes thereof include organic matter denaturation and electrode oxidation, due to moisture or the like penetrated into the organic light-emitting element. Such deterioration problem due to moisture is also found in electronic devices other than the organic light-emitting element in common.

In order to prevent these problems, studies have been made on various techniques for suppressing deterioration of electronic devices, by sealing the electronic devices, and preventing moisture or the like from penetrating into the electronic devices. Further, studies also have been made on techniques for capturing moisture having penetrated into electronic devices, by using hygroscopic substances.

Further, recently, in the field of the organic light-emitting devices, by adapting the solid sealing structure in which a gap between an organic light-emitting-element substrate and a sealing substrate is completely filled with a resin cured material, the thickness of the organic electronic device is further thinned, and an interface reflection of the substrate is suppressed, whereby improvement in visibility has been made. As an example of a hygroscopic composition which is able to form a solid sealing structure, for example, Patent Literature 1 discloses moisture absorbents containing an ultraviolet curing agent (including a translucent monomer and a polymerization initiator) and a moisture absorbing material composed of an organic metal compound having a particular structure.

CITATION LIST

Patent Literatures

Patent Literature 1: JP-A-2005-298598 ("JP-A" means unexamined published Japanese patent application)

SUMMARY OF INVENTION

Technical Problem

However, the water absorbents for organic EL elements described in Examples of Patent Literature 1 is not sufficient for suppression of deterioration due to moisture penetrating into the electronic device, so that it had a problem with insufficiency of the sealing property.

Further, as a resin composition for forming a solid sealing structure, those containing a polymerizable compound and a polymerization initiator have been studied. However, in any of these resin compositions, sometimes a polymerization reaction progressed during storage, or a hygroscopic behavior occurred during work, and therefore there was a room to improve storage stability and handling.

Specifically, the present invention was made under the above circumstances, and is contemplated to provide a curable and hygroscopic resin composition for sealing electronic devices, which is able to form a resin cured material exhibiting an excellent sealing property, and also which is excellent in handling and storage stability.

Further, the present invention is contemplated to provide a resin cured material and an electronic device, which have been embodied by using the above-described curable and hygroscopic resin composition for sealing electronic devices.

Solution to Problem

The present inventors conducted intensive studies on sealing methods that use resin cured materials. The present inventors found that a resin cured material obtained by curing a curable and hygroscopic resin composition which used a radically polymerizable compound, a hygroscopic compound having a particular structure, and a radical polymerization initiator is excellent in a sealing property.

Further, this curable and hygroscopic resin composition was also excellent in storage stability.

That is, the problems of the present invention were solved by the following means.

(1) A curable and hygroscopic resin composition for sealing electronic devices, comprising:
a radically polymerizable compound (a);
a hygroscopic compound (b) containing a structure represented by Formula (1); and
a photo-radical polymerization initiator (c):

Formula (1)

wherein in Formula (1), R designates (i) an acyl group, (ii) a hydrocarbon group, or (iii) a group having at least one selected from the group consisting of —O—, —S—, —CO—, and —NH—, between a carbon-carbon bond of the above-described hydrocarbon group; provided that, a part of hydrogen atoms, which the forgoing groups (i), (ii) and (iii)

each have, may be substituted with a hydroxyl group, a halogen atom or a cyano group; M designates a boron atom or an aluminum atom; n is an integer of 2 to 20; plural R's and M's may be the same or different from each other, respectively; and *1 and *2 each designate a binding site to a terminal group or are bonded to each other.

(2) The curable and hygroscopic resin composition for sealing electronic devices described in the item (1), wherein the radically polymerizable compound (a) is a (meth)acrylate compound.

(3) The curable and hygroscopic resin composition for sealing electronic devices described in the item (1) or (2), wherein the radically polymerizable compound (a) has one or more alicyclic skeletons.

(4) The curable and hygroscopic resin composition for sealing electronic devices described in the item (3), wherein the alicyclic skeleton is at least one of a tricyclodecane skeleton and a hydrogenated bisphenol A skeleton.

(5) The curable and hygroscopic resin composition for sealing electronic devices described in any one of the above items (1) to (4), comprising a solvent (d), wherein the boiling point of the solvent (d) is 100° C. or more.

(6) The curable and hygroscopic resin composition for sealing electronic devices described in the above item (5), wherein the boiling point of the solvent (d) is 160° C. or more.

(7) The curable and hygroscopic resin composition for sealing electronic devices described in the above item (5) or (6), wherein the boiling point of the solvent (d) is 240° C. or more.

(8) The curable and hygroscopic resin composition for sealing electronic devices described in any one of the above items (5) to (7), wherein the solvent (d) is a naphthene-series solvent or an isoparaffin-series solvent.

(9) The curable and hygroscopic resin composition for sealing electronic devices described in any one of the above items (5) to (8), wherein the ratio d/b of the content of the solvent (d) to the content of the hygroscopic compound (b) is 2 or less.

(10) The curable and hygroscopic resin composition for sealing electronic devices described in any one of the above items (1) to (9), wherein the hygroscopic compound (b) is represented by Formula (2):

Formula (2)

wherein, in Formula (2), R¹ has the same meaning as R in Formula (1).

(11) The curable and hygroscopic resin composition for sealing electronic devices described in any one of the above items (1) to (10), wherein the hygroscopic compound (b) is contained in an amount of 0.1 mass % or more and 50 mass % or less, in 100 mass % of the curable and hygroscopic resin composition.

(12) A resin cured material formed by curing the curable and hygroscopic resin composition for sealing electronic devices described in any one of the above items (1) to (11).

(13) An electronic device sealed by curing the curable and hygroscopic resin composition for sealing electronic devices described in any one of the above items (1) to (11).

(14) An electronic device, which is sealed with the resin cured material as described in the above item (12).

In the present invention, the numerical range expressed by using the expression "to" means a range including numerical values before and after the expression "to" as the lower limit and the upper limit.

Further, in the present invention, the term "(meth)acrylate" may be any of a methacrylate and an acrylate, and is used as a collective term. Accordingly, this term includes either one of a methacrylate and an acrylate, and a mixture thereof.

Further, the description of a compound is used in meaning including, in addition to the compound itself, its salt, its ion and its ester. Further, the compound whose substitution or non-substitution is not implicitly expressed in writing means a compound having an arbitrary substituent within the extent which does not undermine the intended efficacy. This applies to the substituent and the like.

Advantageous Effects of Invention

The sealing resin composition of the present invention contains a radically polymerizable compound, a hygroscopic compound having a specific structure, and a photo-radical polymerization initiator. A cured material of this sealing resin composition excels in a sealing property, so that deterioration due to moisture can be suppressed by sealing constituent members of the electronic devices with the cured material.

Further, in the curable and hygroscopic resin composition for sealing electronic devices of the present invention, deterioration of the sealing property in the preservation thereof is suppressed, whereby excellent storage stability is achieved.

Further, the curable and hygroscopic resin composition for sealing electronic devices of the present invention is excellent in handling, and a hygroscopic performance of the composition does not deteriorate, even if the composition is not handled under extremely dry environment such as a glove box and the like.

Other and further features and advantages of the invention will appear more fully from the following description, appropriately referring to the accompanying drawings.

MODE FOR CARRYING OUT THE INVENTION

Hereinafter, the curable and hygroscopic resin composition for sealing electronic devices of the present invention (hereinafter, also referred to simply as a sealing resin composition) and its preferable embodiments, are described in detail with reference to figures. Note that, the embodiments of the present invention are not limited thereto.

Figure 1:
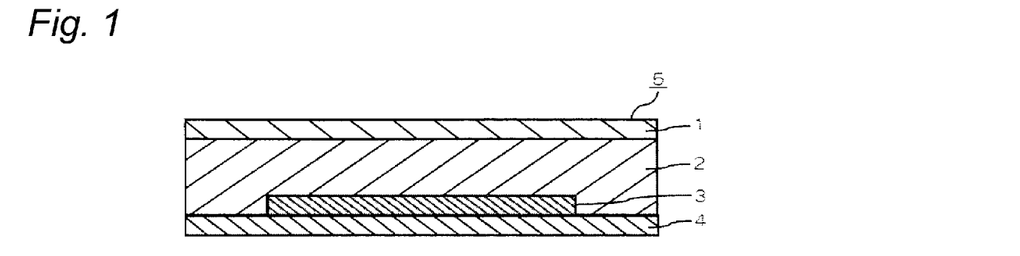
FIG. 1 is a schematic cross-sectional view showing an embodiment in which an organic light-emitting element is sealed with a cured material of the curable and hygroscopic resin composition for sealing electronic devices of the present invention.

The sealing resin composition of the present invention is used, for example, to seal an organic light-emitting element 3 in an organic light-emitting device 5, as shown in FIG. 1. More specifically, the sealing resin composition is provided as a resin cured material 2 between an organic light-emitting element 3 provided on an element substrate 4, and a sealing substrate 1. In this way, the organic light-emitting element 3 is air-tightly sealed with the element substrate 4 and the sealing substrate 1, so that an organic light-emitting device 5 having a solid adhesion sealing structure is obtained. The above description has been given taking the organic light-emitting devices as an example. However the sealing resin composition of the present invention can be used for a variety of electronic devices. Examples of the electronic devices include an organic EL display, an organic EL lighting, an organic semiconductor, and an organic solar cell. Note that the resin cured material 2 means a cured material formed by curing the sealing resin composition of the present invention.

<<Curable and Hygroscopic Resin Composition for Sealing Electronic Devices>>

The sealing resin composition of the present invention is a sealing resin composition containing a radically polymerizable compound (a), a hygroscopic compound (b) having a structure represented by Formula (1), and a photo-radical polymerization initiator (c).

In the present invention, by using a radically polymerizable compound (a), a hygroscopic compound (b) containing a structure represented by Formula (1), and a photo-radical polymerization initiator (c) in combination, a sealing resin composition which is excellent in storage stability is prepared, and by forming a resin cured material therefrom, an excellent sealing property can be achieved.

<Radically Polymerizable Compound (a)>

The radically polymerizable compound (a) is not particularly limited, as long as it initiates a polymerization reaction by radicals generated from a polymerization initiator due to a light.

Examples of the radically polymerizable compound (a) include a monosubstituted ethylene compound (such as a styrene compound, an acrylate compound, an acrylonitrile compound, an acrylamide compound, a vinylester compound, and a vinylamide compound), a 1,1-disubstituted ethylene compound (such as a methacrylate compound, a methacrylamide compound, vinylidene chloride, vinylidene fluoride, and an α-methyl styrene compound), a 1,2-disubstituted ethylene compound (such as a N-alkyl substituted maleimide compound, an acenaphthylene compound, a vinylene carbonate compound, a fumarate compound, and an amide compound), and a diene compound (such as 1,3-butadiene, isoprene, and chloroprene). Among these compounds, a (meth)acrylate compound is preferable, and an acrylate compound is particularly preferable from the viewpoint of the sealing property.

The molecular weight of the radically polymerizable compound (a) is preferably less than 1,000. The lower limit of the molecular weight of the radically polymerizable compound (a) is not particularly limited, but is preferably 300 or more.

The radically polymerizable compound (a) in the present invention preferably contains one or more alicyclic skeletons and one or more polymerizable functional groups (hereinafter, also referred to as "a compound having an alicyclic skeleton"). Incorporation of the alicyclic skeleton allows more efficient suppression of deterioration due to a water molecule in an electronic device when the electronic device is sealed. Although this reason is unknown yet, a supposable reason is as follows. By polymerization of the radically polymerizable compound, bulky and rigid structures of the alicyclic skeleton are proximally positioned in a resin cured material, whereby passing of the water molecule in the resin cured material can be delayed. As a result, the water vapor transmission rate (WVTR) is decreased and a water vapor barrier property is increased. Deterioration of the electronic devices sealed with the foregoing resin due to a water molecule can be suppressed.

Further, it is believed that passage of the water molecule in the resin composition becomes slow even before the curing in account of containing an alicyclic skeleton therein.

In order to lower the water vapor transmission rate, it is more preferable that at least two alicyclic skeletons are incorporated in the radically polymerizable compound molecule.

Further, from the viewpoints of increasing the degree of cross-linkage and decreasing the water vapor transmission rate, it is more preferable that two or more polymerizable functional groups are contained in the radically polymerizable compound molecule.

Specific examples of the polymerizable functional group include a vinyl group, a vinyl ether group, a (meth)acryloyl group, a vinylidene group, and a vinylene group.

As the alicyclic skeleton, a cyclohexane skeleton, an isobornyl skeleton, a decalin skeleton, a norbornane skeleton, a dicyclopentane skeleton, a tricyclodecane skeleton, a hydrogenated bisphenol A skeleton, and a hydrogenated bisphenol F skeleton are preferable; and a tricyclodecane skeleton and a hydrogenated bisphenol A skeleton are more preferable.

As the radically polymerizable compound (a), a compound in which any of the above-described alicyclic skeletons is bonded to an oxygen atom (—O—) of the (meth) acrylate group through one carbon atom of the alicyclic skeleton is more preferable.

Specific examples of the radically polymerizable compound include cyclohexanedialcohol di(meth)acrylate, dicyclopentanyl (meth)acrylate, tricyclodecanedialcohol di(meth)acrylate, cyclohexyl (meth)acrylate, adamantyl (meth)acrylate, isobornyl (meth)acrylate, and tert-butylcyclohexanol (meth)acrylate.

As the radically polymerizable compound, the following articles are commercially available.

Compounds having a cyclohexane skeleton: SR217, SR420, CD406, CD421 and CD401 (each trade name, manufactured by ARKEMA)

Compounds having an isobornyl skeleton: SR506 and SR423 (each trade name, manufactured by ARKEMA); and LIGHT ACRYLATE IB-X and IB-XA (each trade name, manufactured by Kyoeisha Chemical Co., Ltd.)

Compounds having a tricyclodecane skeleton: SR833 (trade name, manufactured by ARKEMA); A-DCP and DCP (each trade name, manufactured by Shin Nakamura Chemical Co., Ltd.); LIGHT ACRYLATE DCP-A (trade name, manufactured by Kyoeisha Chemical Co., Ltd.); and dicyclopentenyl acrylate FA-511AS, dicyclopentenyloxyethyl acrylate FA-512AS, dicyclopentanyl acrylate FA-513AS, dicyclopentenyloxyethyl methacrylate FA-512M, dicyclopentenyloxyethyl methacrylate FA-512MT and dicyclopentanyl methacrylate FA-513M (each trade name, manufactured by Hitachi Chemical Company, Ltd.)

The content of the radically polymerizable compound (a) is preferably 50% by mass or more in 100% by mass of the sealing resin composition, for increasing a water vapor barrier property. In order to maintain a good water vapor barrier property due to a sufficient degree of cross-linkage, the content of the radically polymerizable compound (a) is more preferably 70% by mass or more in 100% by mass of the sealing resin composition. It is particularly preferable that the content of the radically polymerizable compound (a) is more than 80% by mass, because if this is the case, not only an excellent sealing property is achieved, but also an excellent impact protection performance of the sealed light-emitting element is achieved.

The content of the radically polymerizable compound (a) is preferably 99.8% by mass or less in 100% by mass of the sealing resin composition. It is more preferable that the content of the radically polymerizable compound (a) is 90% by mass or less in 100% by mass of the sealing resin composition, because if this is the case, flexibility of the film obtained by curing the sealing resin composition is good.

Further, for viscosity adjustment of the sealing resin composition, a reactive diluent such as a commonly used low molecular (meth)acrylate may be used in combination with the above-described compound having an alicyclic structure. The number of a polymerizable functional group of the reactive diluent to be added for this purpose may be one.

Further in order to give flexibility to the resin cured material, a (meth)acrylate monomer in which an end of a polyolefin such as polybutadiene has been (meth)acrylated through an ester bond or a urethane bond, which has a molecular weight of 1,000 to 100,000, may be appropriately blended thereto as a flexibilizer. Specific examples thereof include CN307, CN308, CN309, CN310 and CN9014 (each trade name, manufactured by ARKEMA); TEAI-1000, TE-2000 and EMA3000 (each trade name, manufactured by Nippon Soda Co., Ltd.); and BAC-45 and SPBDA-S30 (each trade name, manufactured by Osaka Organic Chemical Industry Ltd.).

The above-described compound for viscosity adjustment and a flexibilizer may be appropriately used within an amount in which an effect of the curable resin composition of the present invention is obtained.

<Hygroscopic Compound (b)>

The hygroscopic compound (b) is a compound containing a structure represented by Formula (1).

The resin cured material containing this hygroscopic compound (b) has a good hygroscopic property. This is estimated to be due to the property by which M-OR of the hygroscopic compound (b) reacts with moisture to produce M-OH. Hereinafter, the hygroscopic compound (b) is described in detail.

Formula (1)

In the above-described Formula (1), R designates (i) an acyl group, (ii) a hydrocarbon group, or (iii) a group having at least one selected from the group consisting of —O—, —S—, —CO—, and —NH—, between a carbon-carbon bond of the above-described hydrocarbon group. However, a part of hydrogen atoms, which the forgoing groups (i), (ii) and (iii) each have, may be substituted with a hydroxyl group, a halogen atom or a cyano group. M designates a boron atom or an aluminum atom. n is an integer of 2 to 20. Plural R's and M's may be the same or different from each other, respectively. *1 and *2 each designate a binding site to the terminal group or are bonded to each other.

The carbon number of each of (i) the acyl group, (ii) the hydrocarbon group, or (iii) the group having at least one selected from the group consisting of —O—, —S—, —CO—, and —NH—, between a carbon-carbon bond of (ii) the hydrocarbon group, all of which are designated by the above-described R, is preferably from 1 to 30. From the aspect of compatibility with a radically polymerizable compound (a), the carbon number of R is preferably 20 or less, more preferably 10 or less, still more preferably 8 or less, and particularly preferably 7 or less. Further, the carbon number of R is preferably 2 or more, and more preferably 5 or more in order to prevent from occurrence of outgassing, and to prevent electronic devices from deterioration due to migration of compounds such as alcohols, carboxylic acid and the like derived from the above-described R, which are caused by moisture absorption.

Examples of (i) the acyl group described above include a propenoyl group, a propanoyl group, a hexyloyl group, an octyloyl group, and a stearoyl group.

The (ii) hydrocarbon group is a monovalent hydrocarbon group, and may be linear, branched or cyclic. Examples of the hydrocarbon group include an alkyl group, a cycloalkyl group, an alkenyl group and a cycloalkenyl group. Specific examples thereof include an i-propyl group, a sec-butyl group and an octyl group.

Examples of the above-described (iii) group having at least one selected from the group consisting of —O—, —S—, —CO—, and —NH—, between a carbon-carbon bond of (ii) the hydrocarbon group include those having a structure of -alkylene group-L-alkyl group, or -alkylene group-L-alkylene group-L-alkyl group, proving that —O—, —S—, —CO—, or —NH— is designated by L.

A part of hydrogen atoms, which the forgoing groups (i), (ii) and (iii) each have, may be substituted with a hydroxyl group, a halogen atom or a cyano group. In this case, examples of the halogen atom include a fluorine atom, a chlorine atom, a bromine atom, and an iodine atom.

From the viewpoint of suppressing the outgassing, R is preferably (i) an acyl group.

M designates a boron atom or an aluminum atom. M is preferably an aluminum atom.

n is an integer of 1 to 20, preferably an integer of 2 to 20, more preferably an integer of 2 to 15, and further preferably an integer of 3 to 10.

To each of the sites *1 and *2 in the structure represented by the above-described Formula (1), an end group such as an organic group and the like may be bonded, or the above-described sites *1 and *2 may be bonded to each other to form a ring structure. However, it is preferable that the above-described sites *1 and *2 are bonded to each other to form a ring structure.

Examples of the terminal group include a hydroxy group and an acyl group.

The hygroscopic compound (b) may be a linear compound or a cyclic compound.

The hygroscopic compound (b) preferably includes a 6-membered ring of a cyclic aluminoxane compound having the structure represented by the following Formula (2) (n in the above-described Formula (1) is 3) (hereinafter, this cyclic aluminoxane compound is also referred to as "a particular cyclic aluminoxane compound"). It is considered that a cured material obtained from the sealing resin composition of the present invention exhibits an excellent adhesion property on the grounds that such hygroscopic compound contains the above-described particular cyclic aluminoxane compound. This is thought of as being the reason that such hygroscopic compound has a moderate compatibility with the radically polymerizable compound (a) and gives an adhesive property to the sealing resin composition.

Formula (2)

$R^1$ has the same meaning as R in Formula (1).

Examples of the specific compound include aluminum oxide isopropoxide trimer (ALGOMAER), aluminum oxide hexylate trimer (ALGOMAER 600AF), aluminum oxide octylate trimer (ALGOMAER 800AF), and aluminum oxide stearate trimer (ALGOMAER 1000SF) (trade name in each parenthesis, manufactured by Kawaken Fine Chemicals Co., Ltd.).

For removal of moisture in the sealing resin composition, the content of the hygroscopic compound (b) is preferably 0.1% by mass or more in 100% by mass of the sealing resin composition. If the content of the hygroscopic compound (b) is 1% by mass or more, not only the removal of moisture in the sealing resin composition, but also capture of moisture penetrating after sealing can be achieved, so that this content is more preferable.

If the content of the hygroscopic compound (b) is 50% by mass or less in 100% by mass of the sealing resin composition, a water-vapor barrier property of the resin cured material is not excessively decreased, so that this provides a good balance between suppression of moisture entry into the resin cured material and capture of moisture by the hygroscopic compound (b). In order to keep a good sealing property by the balance between suppression of moisture penetration into the resin cured material and capture of moisture by the hygroscopic compound (b), the content of the hygroscopic compound (b) is more preferably 30% by mass or less.

<Photo-Radical Polymerization Initiator (c)>

As a polymerization initiator, a photo-radical polymerization initiator which generates a radical by light is used.

The photo-radical polymerization initiator can be classified into the following two main kinds in accordance with the way of reaction after light absorption: a type of generating a radical due to an intramolecular cleavage (intramolecular cleavage type) and a type of generating a radical by exchanging hydrogen and an electron between two molecules (hydrogen-withdrawing type and electron-donating type).

Examples of the intramolecular cleavage type include a benzoin compound, a benzyl ketal compound, an α-hydroxyacetophenone compound, an α-aminoacetophenone compound, an acylphosphine oxide compound, a titanocene compound, and an O-acyloxime compound.

Examples of the hydrogen-withdrawing type include a benzophenone compound, a Michler's ketone compound, and a thioxanthone compound.

Examples of commercially available photo-radical polymerization initiator include KAYACURE (DETX-S, BP-100, BDMK, CTX, BMS, 2-EAQ, ABQ, CPTX, EPD, ITX, QTX, BTC, MCA, and the like) (each trade name, manufactured by Nippon Kayaku Co., Ltd.), Irgacure (651, 184, 500, 819, 819DW, 907, 369, 1173, 2959, 4265, 4263, OXE01, and the like) and LUCIRIN TPO (each trade name, manufactured by BASF), and Esacure (KIP100F, KB1, EB3, BP, X33, KT046, KT37, KIP150, TZT, and the like) (each trade name, manufactured by Lamberti).

The photo-radical polymerization initiator (c) is preferably blended in an amount of 0.1 to 10 mass % in 100 mass % of the sealing resin composition.

Moreover, the blending ratio (b/c) (mass ratio) of the hygroscopic compound (b) and the photo-radical polymerization initiator (c) is preferably 0.5 to 5.

The photo-radical polymerization initiator (c) is used in a range of preferably 0.1 to 15 mass parts, more preferably 1 to 10 mass parts, to 100 mass parts of the radically polymerizable compound (a).

The ultraviolet irradiance in curing of the sealing resin composition of the present invention is ordinarily an irradiation intensity (light output) of 5 to 100 mW/cm$^2$, and a dose amount of 500 to 5,000 mJ/cm$^2$, whereby the above-described sealing resin composition is ordinarily cured in an intended irradiation time.

Further, by using in combination with a sensitizer, the polymerization efficiency can be also increased using a long wavelength side of the irradiation energy. As the sensitizer, for example, anthracene compounds, aromatic ketone compounds represented by benzophenone compounds, and thioxanthone compounds may be preferably used.

Specific examples of the anthracene compound include ANTHRACURE (registered trademark) series, UVS-1331 (9,10-dibutoxyanthracene), and UVS-1221 (each trade name, manufactured by Kawasaki Kasei Chemicals Ltd.).

Specific examples of the benzophenone compound include KEMISORB 10, 11, 11S, 12, and 111 (each trade name, manufactured by Chemipro Kasei Kaisha, Ltd).

Specific examples of the thioxanthone compound include DETX and ITX (each trade name, manufactured by LAMBSON).

Adaption of the photo-radical polymerization initiator as a polymerization initiator allows a long-term storage at ordinary temperature, because decomposition of the photo-radical polymerization initiator does not occur at ordinary temperature in a case of non-irradiation of ultraviolet ray. Further, in a case of containing a photo-radical polymerization initiator having a low decomposition temperature, there is almost no difference between the temperature at the time of curing (polymerization) of the sealing resin composition by ultraviolet irradiation and the temperature at the time of using a cured material, so that this causes less heat shrinkage strain and therefore the strain causes less peeling. Further, this has an advantage of no deterioration of peripheral members due to heating. In particular, in a general way, the organic light-emitting element causes deterioration due to a long-term heating at 90° C. or more, whereby lowering of luminance and life duration becomes conspicuous. The sealing resin composition using the foregoing photo-radical polymerization initiator allows sealing without a high-temperature heating, and is excellent as a sealing system of the organic light-emitting element.

Further, polymerization is not initiated by heating, so that it is possible to heat a coater die or a nozzle of spray, at the time of coating, and therefore a coating method is not limited.

<Solvent (d)>

The sealing resin composition of the present invention preferably contains a solvent (d).

The solvent (d) is not particularly limited, as long as it is a compound which is capable of mixing well with any other constituent materials. For example, hydrocarbons (hexane, octane, naphthene, polyisobutylene, polybutene, and the like), alcohols (butanol and the like), ethers, esters, and silicone oils are preferable. The solvent (d) may be used to improve compatibility between the radically polymerizable compound (a) and the hygroscopic compound (b). Further, at the time of adding additives other than the hygroscopic compound (b) to the sealing resin composition, the solvent (d) may be used to preliminarily dissolve the additives therein for subsequent addition.

Examples of the solvent (d) include AF solvents No. 4 to No. 7 (manufactured by JX Nikko Nisseki Energy Co.) as a naphthene-based solvent and IP solvents series (manufactured by Idemitsu Petrochemical Co., Ltd.) as an isoparaffin-based solvent.

The content of the solvent (d) is preferably 0.1% by mass or more in 100% by mass of the sealing resin composition, from the view point of improving compatibility. The upper limit is not particularly limited, but preferably 10 mass % or less.

A content ratio d/b of the solvent (d) and the hygroscopic compound (b) is preferably 2 or less from the viewpoint of water-vapor barrier property. Further, the ratio is preferably 0.25 or more from the viewpoint of compatibility.

Further, from the viewpoints of achieving compatibility and low viscosity, the boiling point of the solvent (d) is preferably 80° C. or more, and more preferably 100° C. or more. From the viewpoint of storage stability, the boiling point of the solvent (d) is preferably 160° C. or more, and the boiling point of the solvent (d) is preferably 240° C. or more, because deterioration of the light-emitting element due to outgassing can be suppressed. The upper limit is not particularly limited, but preferably 400° C. or less.

(Additive)

The sealing resin composition of the present invention may contain any of other additives, to the extent in which they do not deteriorate the sealing property of the resin cured material. Examples of the foregoing additives include: a diluent, a tackifier, a crosslinking aid, a frame retardant, a polymerization inhibitor, a filler, a coupling agent, and the like.

<Characteristics of Curable and Hygroscopic Resin Composition for Sealing Electronic Devices and Resin Cured Material>

Characteristics of the sealing resin composition of the present invention and a resin cured material which is a cured material of the sealing resin composition are described below.

In the sealing resin composition of the present invention, its decomposition can be suppressed by shielding light until polymerization reaction initiation.

(Sealing Property: Calcium Corrosion Test)

The calcium corrosion test can be conducted in accordance with the evaluation method described in Examples.

Note that, this calcium corrosion test is to measure a sealing capability of the resin cured material, by using a fact that silver-white-colored metal calcium having a metallic luster, which has been sealed with the resin on a glass substrate, reacts with a water molecule penetrated into the resin to form a transparent calcium hydroxide. For this reason, this test is a test method which is closer to an image of the actual sealing.

Figure 5A:
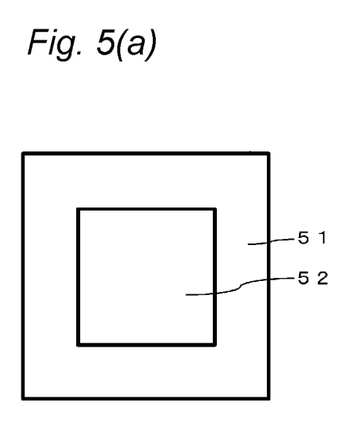
FIG. 5(a) is a view through the intermediary of a glass substrate, showing a test specimen to be used for a calcium corrosion test.
Figure 5B:
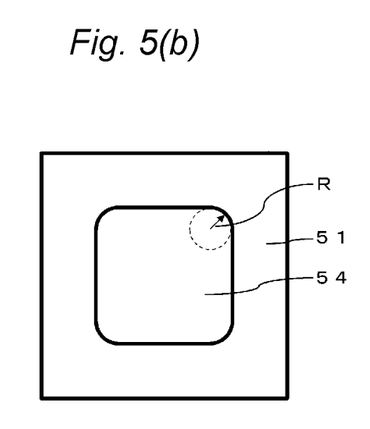
FIG. 5(b) is a view through the intermediary of a glass substrate, showing a corroded state of four corners of a metal calcium layer in the test specimen used for a calcium corrosion test.

In the test specimen used in the above-described test, the curvature radius R at the corner portion of the metal calcium layer 54 after test, as shown in FIG. 5(*b*), is preferably less than 5 mm, and more preferably less than 1 mm.

In the above-described test, if the curvature radius R is less than 5 mm, this means that in a case where an electronic device has been sealed with this resin, the moisture penetration into the electronic device is sufficiently low, and therefore this resin can be preferably used for sealing of the electronic device.

Note that the evaluation of the water vapor barrier test described below does not necessarily correspond to the evaluation of the above-described calcium corrosion test. The evaluation that the water vapor transmission rate is low in the water vapor barrier test can be cited as one of reasons for a good evaluation in the above-described calcium corrosion test. However, the entry route of the water molecule includes: a route through the sealing resin from a contact face between the atmosphere and the resin cured material; and in addition a route through an interface (sealing interface) between the resin cured material and a substrate. For this reason, if adhesion between the resin cured material and the substrate is not enough, an affection of moisture routed through the sealing interface becomes larger, so that evaluations of the water vapor barrier property test and the calcium corrosion test sometimes discord from each other. In other words, in the calcium corrosion test, a sealing property can be confirmed from the viewpoints including an adhesion property.

(Storage Stability)

The storage stability evaluation of a sealing resin composition can be conducted in accordance with the test method described in Example.

In the sealing resin composition, sometimes polymerization reaction gradually progresses dependent on its storage conditions, and the sealing resin composition turns into a gel, which results in lowering of fluidity. If the fluidity is lowered, a coating property is sometimes lowered.

The period of time until the fluidity in the test method is lost is preferably 4 days or more.

It is preferable that the sealing resin composition of the present invention and its cured material further have the following characteristics.

(Compatibility (after Blended but Before Cured))

The compatibility test in a state after blended but before cured the sealing resin composition, can be conducted in accordance with the method described in Examples.

A preferable compatibility of the sealing resin composition can be judged on the criteria described in Example.

Note that, a two layer-separated state is not preferred, because it is impossible to uniformly cure the composition.

(Compatibility (after Cured))

Further, the compatibility test in a state after cured the blended sealing resin composition can be conducted in accordance with the evaluation method described in Examples.

A preferable compatibility of the resin cured material can be judged on the criteria described in Example. In the situation where a phase separation is not seen due to white turbidity, the resin cured material is not uniformly cured, and therefore this situation is not preferable.

(Viscosity)

Measurement of the resin viscosity can be conducted in accordance with the evaluation method described in Examples.

The complex viscosity n* of the sealing resin composition is preferably 5 Pa·s or less, and more preferably 2 Pa·s or less. If the complex viscosity n* is 5 Pas or less, a coating work to a sealing substrate is easy.

(Amount of Outgas)

In the sealing resin composition of the present invention, an amount of organic gas (hereinafter, also referred to as "outgas," which may contain moisture) emitted from the resin cured material can be reduced. The measurement of the amount of outgas can be conducted in accordance with the evaluation method described in Examples. The amount of emitted outgas is preferably 500 ppm or less, and more preferably 300 ppm or less. When the amount of emitted outgas is adjusted to 500 ppm or less, deterioration of the sealed element for the electronic device due to the outgas can be further suppressed.

In order to adjust the amount of emitted outgas to 500 ppm or less, solvents and volatile organic molecules in the sealing resin composition or the resin cured material should be removed by means of a dryer such as a conical dryer, and an evaporator, or a drying furnace when the resin composition is processed into a film form.

(Water Vapor Barrier Property)

The water vapor barrier property test can be conducted in accordance with the evaluation method described in Examples.

The moisture permeability of a 100 µm-thick resin cured material to be measured in the above-described water vapor barrier property test, which is formed by curing the above-described sealing resin composition, is preferably 100 $g/m^2 \cdot 24$-hr or less, and more preferably 50 $g/m^2 \cdot 24$-hr or less, under the conditions of 40° C. and 90% relative humidity. Note that the lower limit thereof is 1 $g/m^2 \cdot 24$-hr or more in practice.

The above-described sealing resin composition can be used by directly coating it on an electronic device. Further, the above-described sealing resin composition can be shaped in the form of a film or the like, and can be used by incorporating it in the electronic device.

<<Resin Cured Material>>

The resin cured material of the present invention can be obtained by curing the above-described sealing resin composition of the present invention. The sealing resin composition can be used to apply it on an adherend such as a substrate and the like by coating and then by curing it in the shape of a film, a block, or the like. Further, an electronic device can be composed by using a preliminarily cured material of the sealing resin composition in the shape of a film, a block, or the like.

The resin cured material of the present invention is used for an electronic device and the like. The shape and the shaping conditions of the resin cured material, or its specific advantageous effect are described in the following electronic device.

<<Electronic Device>>

The electronic device of the present invention is an electronic device, preferably an organic electronic device, sealed by curing the above-described sealing resin composition or using the above-described resin cured material of the present invention.

Hereinafter, as an example of the organic electronic device, an organic light-emitting device (image display device) is described.

An organic light-emitting device 5 as shown in FIG. 1 has a structure which is responsive to any of a so-called top emission type and bottom emission type. An organic light-emitting element 3 provided on an element substrate 4 is sealed with a sealing substrate 1 through a resin cured material 2. The resin cured material 2 means a cured material which has been formed by curing the sealing resin composition of the present invention.

Note that, as to the foregoing organic light-emitting device 5, a sealing lateral face thereof may be exposed, as shown in FIG. 1. In other words, it is not necessarily needed to conduct an additional tight sealing processing, by a glass frit, an adhesive, or the like, as a side-surface sealant. In this manner, lightweight and cost-cutting can also be achieved by eliminating an additional tight sealing processing with a glass frit and the like as just described, and thereby simplifying a structure of the organic light-emitting device 5.

Further, in a case where a rigid glass frit is not used, the use of a flexible material for the element substrate 4 and the sealing substrate 1 allows the provision of a so-called flexible device in which flexibility has been given to the organic light-emitting device 5 itself. Further, the device as a whole is flexible and lightweight, and therefore becomes less destructible, even if the device is subjected to impact, such as a fall.

Figure 2:
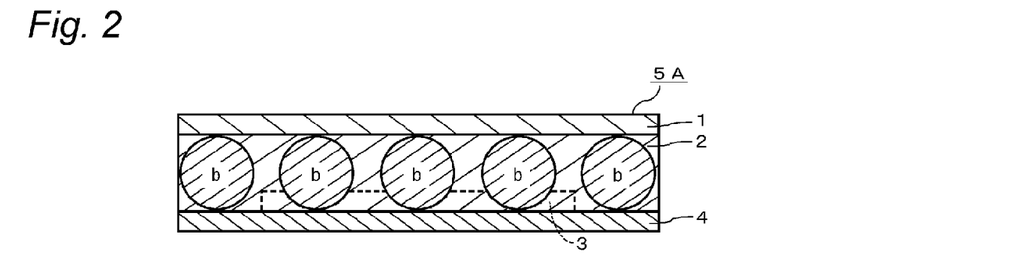
FIG. 2 is a schematic cross-sectional view showing one embodiment in which an organic light-emitting element is sealed with a cured material of the curable and hygroscopic resin composition for sealing electronic devices of the present invention, together with a spacer, for a uniform sealing.

In the present invention, other than the organic light-emitting device 5 as shown in FIG. 1, an organic light-emitting device 5A as shown in FIG. 2 is also preferred. In FIG. 2, in order to increase parallelism between a sealing substrate 1 and an element substrate 4, a spacer b having a proper height to a thickness of the resin cured material is incorporated in the resin cured material. FIG. 2 shows a cross-section when the organic light-emitting device 5A is cut parallel to end edges of an organic light-emitting element 3 in a non-existence region of the organic light-emitting element 3 (shown by a dotted line).

Regarding the height of the spacer b to be used, substantially the same height in any of spacers b is preferable from the viewpoint of increasing parallelism between the sealing substrate 1 and the element substrate 4.

As to the spacer b, it is preferred to use a spherical shaped filler, or a pillared pillar formed by a photolithography. Further, as to the material of the spacer b, either organic or inorganic materials may be adopted, unless there is a danger that any of them are crushed and destroyed by a pressure at the time of sealing an organic light-emitting element. Note that, as regards the material, an organic resin is preferred, because the organic resin is excellent in affinity to the sealing resin composition or the resin cured material of the present invention, and a cross-linked acrylic resin is more preferred, because deterioration of the sealing property is lessened.

Examples of the spacer b include ENEOS Unipowder (trade name) manufactured by JX Nikko Nisseki Energy Co., and HAYABEADS (trade name) manufactured by HAYAKAWA RUBBER CO., LTD.

The placement density of the spacer b is preferably 10 pieces/mm$^2$ or more, more preferably 50 pieces/mm$^2$ or more, and still more preferably 100 pieces/mm$^2$ or more, from the viewpoints of increasing parallelism between the sealing substrate 1 and the element substrate 4, and maintaining uniformity of the distance between the top and bottom substrates.

If the viscosity of the sealing resin composition gets too high, a coating work becomes difficult. From the viewpoint of a sealing resin composition viscosity, the placement density of the spacer b is preferably 1,000 pieces/mm$^2$ or less, more preferably 500 pieces/mm$^2$ or less, and still more preferably 300 pieces/mm$^2$ or less.

From the viewpoint of a surface asperity-tracking performance with respect to a substrate (sealing face), the thickness of the resin cured material is preferably 0.5 μm or more, more preferably 1 μm or more, and still more preferably 2 μm or more. If the thickness of the resin cured material is 0.5 μm or more, surface asperity of the organic light-emitting element can be sufficiently absorbed, and resultantly a space between substrates can be completely sealed.

Further, from the viewpoint of a sealing property, the thickness of the resin cured material is preferably 100 μm or less, more preferably 50 μm or less, and still more preferably 30 μm or less. If the thickness of the resin cured material is 100 μm or less, the area of the resin cured material exposing to the atmosphere does not get too large, which results in providing a balance of the moisture entry amount and the moisture capture.

In a case of using a spacer b, the thickness of the resin cured material gets approximately the same as the height of the spacer b.

Figure 3:
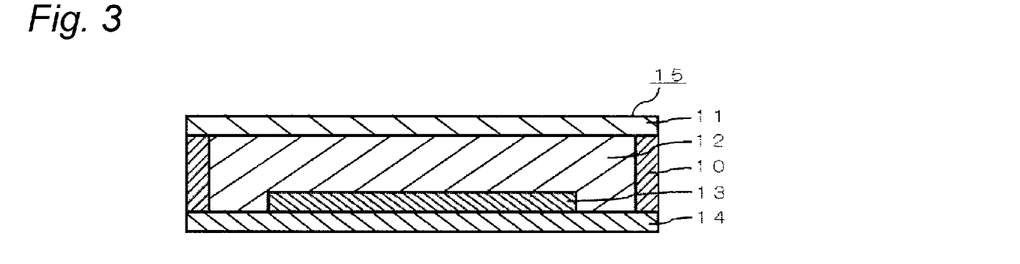
FIG. 3 is a schematic cross-sectional view showing another embodiment in which an organic light-emitting element is sealed with a cured material of the curable and hygroscopic resin composition for sealing electronic devices of the present invention.

The sealing resin composition of the present invention may be used for the organic light-emitting device 15 as shown in FIG. 3, which has been subjected to an additional tight seal processing by forming a side-surface sealing structure 10 with a side-surface sealant (a glass frit or an adhesive) or the like, so as to surround a resin cured material 12. As the side-surface sealing structure 10, a dam structure portion may be formed by an adhesive, a gas barrier sealant, or a glass frit cured material and the like. In this case, by synergistic effects of the resin cured material of the present invention and the side-surface sealing structure 10, a high airtightness is maintained. For this reason, an organic light-emitting device 15, in which a resin cured material 12 obtained from the sealing resin composition of the present invention is used in combination with the side-surface sealing structure 10, is preferred, from the viewpoint of realizing a long life of the organic light-emitting device 15.

Figure 4:
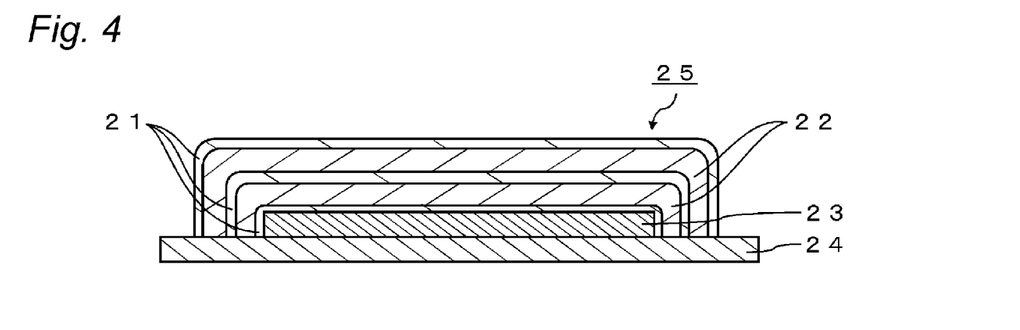
FIG. 4 is a schematic cross-sectional view showing still another embodiment in which an organic light-emitting element is sealed with a cured material of the curable and hygroscopic resin composition for sealing electronic devices of the present invention.

Further, the resin cured material obtained by the sealing resin composition of the present invention may be used for an organic light-emitting device 25 as shown in FIG. 4. In the organic light-emitting device 25, an organic light-emitting element 23 formed on a gas-barrier element substrate 24 has been subjected to a tight seal processing by a multi-layer lamination of an inorganic thin film 21 and an organic thin film 22. In this case, the resin cured material is formed as the organic thin film 22. By synergistic effects of the organic thin film 22 obtained by the sealing resin composition of the present invention and the inorganic thin film 21, a high airtightness is maintained. The number of the above-described lamination is not limited to the embodiment shown in FIG. 4 and can be arbitrarily designed, as long as the above-described effects can be obtained by it.

Herein, the inorganic thin film 21 is composed of a silicon nitride compound, a silicon oxide compound, an aluminum oxide compound, aluminum or the like. The thickness of a single layer of the inorganic thin film 21 is preferably 1 μm or less from the viewpoint of flexibility.

The thickness of a single layer of the organic thin film 22 is preferably 5 μm or less from the viewpoint of flexibility. However, from the viewpoint of resistance to impact of the organic EL element, the thickness thereof is preferably 1 μm or more and more preferably 5 μm or more.

A production method of an organic light-emitting device using the sealing resin composition of the present invention is as follows.

On the above occasion, specific examples of a method of coating the sealing resin composition include: a spin coating method, a dip coating method, a spray coating method, a slit coating method, a bar coating method, a roll coating method, a gravure printing method, a flexographic printing method, a screen printing method, and a flow coating method.

Regarding the organic light-emitting device 5 which has not been subjected to a tight seal processing at sides as shown in FIG. 1, firstly, on an organic light-emitting-element substrate 4 on which an organic light-emitting element 3 has been formed in the form of lamination, a suitable amount of the sealing resin composition of the present invention is coated so as to cover the organic light-emitting element 3, and further a sealing substrate 1 is placed thereon from above so as to sandwich the sealing resin composition of the present invention in between the element substrate 4 and the sealing substrate 1. In this way, a tight sealing is performed so as not to form voids in between the element substrate 4 and the sealing substrate 1. After that, the sealing resin composition of the present invention is cured by ultraviolet irradiation, to form a resin cured material 2, so that a sealing is completed.

Alternatively, the sealing may be also conducted in a different manner. Firstly, a sealing resin composition of the present invention is coated on a sealing substrate 1, and then this sealing resin composition is sandwiched in between the sealing substrate 1 and an element substrate 4 on which an organic light-emitting element 3 has been formed in the form of lamination. After that, the sealing resin composition of the present invention is cured by ultraviolet irradiation to form a resin cured material 2.

The structure of decreasing moisture entry from the side of the resin cured material 12 by forming a side-surface sealing structure 10 as shown in FIG. 3 can be produced as described below. In first, the side-surface sealing structure 10 is formed on the element substrate 14 or the sealing substrate 11, so as to surround an organic light-emitting element 13. Thereafter, the sealing resin composition of the present invention is cast into the inside of the side-surface sealing structure 10, and further the sealing resin composition of the present invention is sandwiched with another substrate. At this moment, the element substrate 14, the sealing substrate 1, and the side-surface sealing structure 10 should not cause a space among them. After that, the sealing resin composition of the present invention is cured by ultraviolet irradiation, to form a resin cured material 12, thereby completing a sealing.

It is preferable to carry out these sealing processes under a dry environment, because deterioration in the hygroscopic property of the sealing resin composition of the present invention can be lessened.

The organic light-emitting device 25 as shown in FIG. 4 may be produced as follows. At first, an organic light-emitting element 23 is formed on a gas-barrier element substrate 24, and the top and sides of this organic light-emitting element 23 is covered with an inorganic thin-film 21. Further, the sealing resin composition of the present invention is coated on the inorganic thin-film 21, and this composition is cured, thereby forming an organic thin-film 22. Further, an inorganic thin-film 21 is formed on this organic thin-film. If needed, formation of the organic thin-film 22 and the inorganic thin-film 21 is repeated.

The inorganic thin-film 21 may be formed by plasma CVD (PECVD), PVD (physical vapor deposition), ALD (atomic layer deposition) or the like.

The organic thin-film 22 may be formed by coating the sealing resin composition of the present invention by a known method such as an inkjet method, a spray coat method, a slit coat method, a bar coat method, or the like, and thereafter by curing it by an ultraviolet irradiation.

In the organic light-emitting device using the sealing resin composition of the present invention, a color filter for chromaticity adjustment may be installed. Regarding an installation location of the color filter in this case, in the case of the embodiments shown in FIGS. 1 to 3, the color filter may be installed in between the resin cured material 2(12) and the sealing substrate 1(11) or the element substrate 4(14), or the color filter may be installed so as to sandwich the element substrate 4(14) in between the color filter and an organic light-emitting element 3(13), or alternatively may be installed so as to sandwich the sealing substrate 1(11), the resin cured material 2(12) and the organic light-emitting element 3(13) in between the color filter and the element substrate 4(14). In a case of the embodiment shown in FIG. 4, the color filter may be installed above the inorganic thin film 21 located at the outermost side, or below the element substrate 24. In this case, it is preferred that the color filter is immobilized with the sealing resin composition of the present invention or another transparent resin composition.

EXAMPLES

The present invention will be described in more detail based on examples given below, but the invention is not meant to be limited by these.

<<Preparation of Curable and Hygroscopic Resin Composition for Sealing Electronic Devices>>

Example 1

9.7 g of SR833 (trade name, manufactured by ARKEMA) as a radically polymerizable compound (a), 0.1 g of ALGOMAER 800AF (trade name, manufactured by Kawaken Fine Chemicals Co., Ltd.) as a hygroscopic compound (b), 0.1 g of a Esacure TZT (trade name, manufactured by Lamberti) as a polymerization initiator (c), and 0.1 g of hexane as a solvent (d) were added and stirred until the mixture becomes homogeneous, to obtain a sealing resin composition.

Examples 2 to 10 and Comparative Examples 1 to 3

The sealing resin compositions of Examples 2 to 10 and Comparative Examples 1 to 3 were prepared in the same manner as in Example 1, except that the constituent materials shown in Table 1 were blended so that a total becomes 10 g, by using the constituent materials in the amounts in terms of mass % shown in Table 1, in place of the constituent materials used in Example 1.

Note that the units (mass %) of constituent materials (a) to (d) in Table 1 were omitted in the description.

In order to blend the sealing resin compositions, the following chemicals were used.

—Radically Polymerizable Compound (a)—
FA-513AS (trade name, manufactured by Hitachi Chemical Company, Ltd., dicyclopentanyl acrylate)
CD406 (trade name, manufactured by ARKEMA, cyclohexane dimethanol diacrylate)
SR833 (trade name, manufactured by ARKEMA, tricyclodecane dimethanol diacrylate)
DCP (trade name, manufactured by Shin Nakamura Chemical Co., Ltd., tricyclodecane dimethanol diacrylate)
Divinylbenzene (manufactured by Tokyo Chemical Industry Co., Ltd.)

—Hygroscopic Compound (b)—
ALCH (aluminum ethyl acetoacetate/diisopropylate)
Algomaer 600AF (aluminum oxide hexylate trimer)
Algomaer 800AF (aluminum oxide octylate trimer)
Algomaer 1000SF (aluminum oxide stearate trimer)
Algomaer (aluminum oxide isopropoxide trimer)
(each trade name, manufactured by Kawaken Fine Chemicals Co., Ltd.)

Among the above chemicals, ALGOMAER 600AF, ALGOMAER 800AF, and ALGOMAER 1000SF are supplied in a form of a solution, and therefore they were evaporated to dryness by an evaporator before use.

—Polymerization Initiator (c)—
V-601 (trade name, manufactured by Wako Pure Chemical Industries, Ltd., diethyl-2,2'-azobis(2-methylpropionate), heat radical polymerization initiator)
Esacure TZT (manufactured by Lamberti, mixture of trimethylbenzophenone and methylbenzophenone, photo-radical polymerization initiator)

—Solvent (d)—
Hexane (manufactured by Wako Pure Chemical Industries, Ltd., boiling point: 68° C.)
Butanol (manufactured by Wako Pure Chemical Industries, Ltd., boiling point: 117° C.)
AF-7 SOLVENT (trade name, manufactured by JX Nikko Nisseki Energy Co., solvent consisting of naphthene as a primary component, boiling point: 260° C.)

<<Evaluation Method>>

With respect to the sealing resin compositions prepared in the above-described Examples 1 to 10 and Comparative Examples 1 to 3, the following evaluations were conducted in a clean room controlled at 25° C. and 50% relative humidity. The results are shown in Table 1.

<Calcium Corrosion Test>

The calcium corrosion test is explained with reference to FIGS. 5(a-b), as necessary.

A commercially-available glass substrate (transparent glass) having dimensions of 1.2 mm×22.5 mm×24 mm was subjected to an ultrasonic cleaning at 45° C. for 10 minutes. Further, ozone cleaning was performed by UV cleaning for 30 minutes to blow off organic matters on the surface thereof. Then, on the glass substrate, a metal calcium layer 52 having dimensions of 10 mm×10 mm square and thickness of 100 nm was formed by vacuum deposition equipment. Then, 10 μL of the sealing resin composition prepared in the above was put drop-wise on the metal calcium layer, and further a sealing glass (transparent glass) of 0.15 mm×18 mm×18 mm was put on a top of the metal calcium layer. The sealing resin composition was spread in between the sealing glass and the glass substrate or the metal calcium layer, whereby a layer having almost the same size as the sealing glass surface was formed. Then ultraviolet ray (exposure: 3,000 mJ/cm$^2$) was irradiated with 50 mW/cm$^2$ for 60 seconds using an ultraviolet irradiator, thereby obtaining a test specimen.

Further, in Comparative Example 3, a test specimen was obtained in the same manner as described above, except that the sealing resin composition was cured by putting it in a heating furnace at 100° C. for 60 minutes in place of ultraviolet irradiation.

The thickness of the resin cured material 51 after curing was each 30 μm.

Herein, a distance from an outer circumferential side of the sealing glass to an outer circumferential side of the metal calcium layer, was equally set to 4 mm in each of 4 sides. FIG. 5(a) is a view of the above-described test specimen which can be seen through a glass substrate (however, the above-described sealing glass portion is omitted in this view).

The obtained test specimen was stored under high-temperature and high-humidity of 60° C. and 90% relative humidity, and then a corner portion of the metal calcium layer 54 after a lapse of 48 hours was observed.

More specifically, the metal calcium layer 52 has silver-gray in color with metallic luster. However, with a progress of corrosion, a corroded portion thereof gets to a transparent calcium hydroxide. For this reason, the corner portion of the metal calcium layer after the test 54 (the border between the metal calcium portion and the calcium hydroxide portion) appears to be waney. The corrosion degree in this test was evaluated by using a curvature radius R at the corner portion of the metal calcium layer after the test 54, as shown in FIG. 5(b).

The curvature radius R was evaluated as follows.

An image of the metal calcium layer after the test 54 was obtained by photographing the thus-obtained test specimen from above. In the corner portion of the metal calcium layer 54 after the test on the obtained image, a circle (circle of curvature) was drawn along the roundness of the corner portion while having contact with 2 sides forming the corner portion, like a circle shown with the dotted line in FIG. 5 (b). Then, the radius of the circle (curvature radius) was measured. With respect to all of 4 corners of one test specimen, their curvature radii were measured. Of the obtained 4 curvature radii, the largest radius was defined as the curvature radius R of the test specimen and the curvature radius was evaluated by the following criteria.

The un-corroded test specimen, in other words, the test specimen whose curvature radius R at the roundness at the corner portion of the metal calcium layer due to corrosion, is 0 mm, was rated as "A". The corroded test specimen whose curvature radius R is more than 0 mm and less than 1 mm, was rated as "B". The corroded test specimen whose curvature radius R is 1 mm or more and less than 5 mm, was rated as "C". The corroded test specimen whose curvature radius R is 5 mm or more, was rated as "D". The ranks A to C were judged as being acceptable.

Note that ALCH-added Comparative Example 1 was judged unmeasurable (described as "NA" in Table 1), because a peeling from the sealing interface was observed in 24 hours after the beginning of the above-described high-temperature and high-humidity storage (60° C., relative humidity 90%).

<Storage Stability>

10 ml of each of the above-prepared sealing resin compositions was put in a transparent glass vessel (volume: 50 ml) instantly after the preparation thereof, was tight sealed, and was stored at room temperature (25° C.) under ambient light. A period elapsing from the time point of putting this sealing resin composition in the glass vessel up to the point of time when fluidity has become undetectable in the sealing resin composition was measured, and this elapsed time was defined as storage stability. Confirmation of the fluidity was performed by inclining the above-described glass vessel and by visually observing the state of the sealing resin composition at that moment. Specifically, by inclination of the glass vessel at 90°, the point of time when a deformation of the sealing resin composition was not confirmed within 10 seconds was defined as "the point of time when fluidity has become undetectable". In a case where the elapsed time is 4 days or more, the storage stability can be evaluated as being good.

In addition, as reference characteristics required for the sealing resin composition, the following evaluations were also made.

<Compatibility Test (after Blended but Before Cured)>

The mass % shown in Table 1 of the radically polymerizable compound (a), the hygroscopic compound (b), and the polymerization initiator (c) (and the solvent (d) when the solvent (d) was used) were blended so as to be a total of 10 g, followed by stirring at room temperature (23° C.) for 1 hour, to obtain sealing resin compositions. After stirring, the sealing resin compositions were left to stand. The states of the compositions after 24 hours were confirmed with the naked eye.

A transparent state (a state in which the sealing resin composition has the same degree of transparency as the radically polymerizable compound (a) incorporated therein) was rated as "A". A clouded state (a state in which the sealing resin composition has a lower transparency than the radically polymerizable compound (a) incorporated therein to the extent that a difference can be visually determined) was rated as "B", and a two-layer separated state was rated as "C".

<Compatibility Test (after Cured)>

The above-described sealing resin composition after left stood for 24 hours was coated so as to have the thickness of 100 μm, on a 50 μm-thick release-processed PET film (trade name "E7004", manufactured by Toyobo Co., Ltd.). Further, a 25 μm-thick release-processed PET film (trade name "E7004", manufactured by Toyobo Co., Ltd.) was laminated on the coated sealing resin composition.

In Examples 1 to 10 and Comparative Examples 1 and 2, to the thus-obtained sealing resin composition sandwiched with 2 sheets of the release-processed PET films, ultraviolet ray was irradiated with 50 mW/cm$^2$ for 60 seconds (exposure: 3,000 mJ/cm$^2$) using an ultraviolet irradiator (US5-0151, trade name, manufactured by EYE GRAPHICS CO., LTD.), and then the 2 sheets of release-processed PET films were stripped off, to obtain a cured film of the sealing resin composition.

Further, regarding Comparative Example 3, a cured film of the sealing resin composition was obtained by peeling 2 sheets of release-processed PET films after putting the sealing resin composition in a heating furnace at 100° C. for 60 minutes in place of ultraviolet irradiation.

The state of each of these cured films was visually confirmed from upper with respect to the cured film plane.

A transparent state (a state in which the cured film has the same degree of transparency as the radically polymerizable compound (a) incorporated in the above-described sealing resin composition before cured) was rated as "A". A state in which the cured film is transparent, but a phase separation is detectable due to a difference in a refractive index was rated as "B". A state in which the cured film is cloudy and a phase separation is undetectable (the cloudiness means a state in which the cured film has a lower transparency than the radically polymerizable compound (a) incorporated in the above-described sealing resin composition before cured, to the extent that its difference can be visually determined) was rated as "C".

<Viscosity Measurement>

The sealing resin composition prepared in the above was left to stand for 1 hour, and then a complex viscosity n* at an angular velocity of shear rate of 1 s$^{-1}$ and an ordinary temperature (25° C.) was measured, in a dynamic viscoelasticity measuring instrument (instrument name "ARES", manufactured by Leometric Scientific F. E. Co., Ltd), using a cone plate having a cone diameter of 25 mm and a cone angle of 0.1 rad.

The resin composition having the complex viscosity n* of 2 Pa·s or less was rated as "A". The resin composition having the complex viscosity n* of more than 2 Pas and 5 Pa-s or less was rated as "B". The resin composition having the complex viscosity n* of more than 5 Pas was rated as "C".

<Amount of Outgas>

Using a 100 μm-thick cured film of the sealing resin composition, which was prepared in the same manner as the test specimen of the above-described compatibility test (after cured), an amount of outgas was measured by the gas chromatographic analysis method specified in JIS K 0114.

Specifically, 3 mg of the sample (thickness 100 μm, 1 cm×3 mm) was used and was heated at 100° C. for 20 minutes using a MULTI-SHOT PYROLYZER PY-3030D manufactured by Frontier Laboratories Ltd., and an amount of the desorption gas was analyzed. By using UA+−5 manufactured by Frontier Laboratories Ltd. for a column, and also using JMS-Q1050GC manufactured by JEOL Ltd. for a GC/MS analyzer, quantification was performed in terms of the toluene-equivalent.

The cured film with the amount of outgas of 300 ppm or less was rated as "A". The cured film with the amount of outgas of more than 300 ppm and 500 ppm or less was rated as "B". The cured film with the amount of outgas of more than 500 ppm was rated as "C".

<Water Vapor Barrier Test>

A 100 μm-thick cured film, which was prepared in the same manner as the test specimen of the above-described compatibility test (after cured), was used as a test object. The moisture permeability was measured, under the condition of 40° C. and 90% relative humidity, in accordance with the moisture permeability test method (cup method) of the moisture-proof packaging material described in JIS Z 0208.

Note that, when a film is put into a thermostat chamber of 40° C. and 90% relative humidity, there is a possibility that the cured film swells due to a change in volume of the air in the cup, so that the surface area and the thickness of the sample film are changed, and as the result, the measured value becomes inaccurate. For this reason, the cured film was reinforced with a 20 μm-thick cellophane. The moisture permeability of the 20 μm-thick cellophane is 3,000 g/m$^2$/24-hr at the same condition as the above, which is much larger than the moisture permeability of the cured film of each of Examples and Comparative Examples, and therefore the cellophane does not interfere with the measurement in the moisture permeability of the cured film.

In a case where the moisture permeability is 100 g/m$^2$·24 h or less, the water vapor barrier property can be evaluated as being good.

In Table 1, the unit (g/m$^2$·24 h) in the water vapor barrier test was omitted.

TABLE 1

| Curable and hygroscopic resin composition for sealing electronic devices | | Comparative Example | | |
|---|---|---|---|---|
| | | 1 | 2 | 3 |
| Radically polymerizable compound (a) | Divinylbenzene | — | — | — |
| | FA-513AS | — | — | — |
| | CD406 | — | — | — |
| | SR833 | 97 | 98 | 97 |
| | DCP | — | — | — |
| Hygroscopic compound (b) | ALCH | 1 | — | — |
| | Algomaer | — | — | — |
| | Algomaer 1000SF | — | — | — |
| | Algomaer 600AF | — | — | — |
| | Algomaer 800AF | — | — | 1 |
| Polymerization initiator (c) | Esacure-TZT | 1 | 1 | — |
| | V-601 | — | — | 1 |
| Solvent (d) | Hexane | — | — | — |
| | Butanol | — | — | — |
| | AF-7 solvent | 1 | 1 | 1 |
| Total (mass %) | | 100 | 100 | 100 |
| Calcium corrosion test | | NA | D | A |
| Storage stability | | 7 days or more | 7 days or more | 2 days |
| Reference characteristic | Compatibility before cured | A | A | A |
| | Compatibility after cured | A | A | A |
| | Viscosity | A | A | A |
| | Outgas | C | A | A |
| | Water vapor barrier test | 12 | 10 | 20 |

| Curable and hygroscopic resin composition for sealing electronic devices | | Example | | | | |
|---|---|---|---|---|---|---|
| | | 1 | 2 | 3 | 4 | 5 |
| Radically polymerizable compound (a) | Divinylbenzene | — | — | — | — | — |
| | FA-513AS | — | — | 97 | — | — |
| | CD406 | — | — | — | 97 | — |
| | SR833 | 97 | 97 | — | — | 97 |
| | DCP | — | — | — | — | — |

TABLE 1-continued

| Curable and hygroscopic resin composition for sealing electronic devices | | Example | | | | |
|---|---|---|---|---|---|---|
| | | | | | | |
| Hygroscopic compound (b) | ALCH | — | — | — | — | — |
| | Algomaer | — | — | — | — | — |
| | Algomaer 1000SF | — | — | — | — | — |
| | Algomaer 600AF | — | — | — | — | — |
| | Algomaer 800AF | 1 | 1 | 1 | 1 | 1 |
| Polymerization initiator (c) | Esacure-TZT | 1 | 1 | 1 | 1 | 1 |
| | V-601 | — | — | — | — | — |
| Solvent (d) | Hexane | 1 | — | — | — | — |
| | Butanol | — | 1 | — | — | — |
| | AF-7 solvent | — | — | 1 | 1 | 1 |
| Total | (mass %) | 100 | 100 | 100 | 100 | 100 |
| | Calcium corrosion test | C | C | B | B | A |
| | Storage stability | 7 days or more | 7 days or more | 7 days or more | 7 days or more | 7 days or more |
| Reference characteristic | Compatibility before cured | A | B | A | A | A |
| | Compatibility after cured | A | B | A | A | A |
| | Viscosity | A | A | A | A | A |
| | Outgas | C | B | A | A | A |
| | Water vapor barrier test | 30 | 20 | 40 | 35 | 15 |

| Curable and hygroscopic resin composition for sealing electronic devices | | Example | | | | |
|---|---|---|---|---|---|---|
| | | 6 | 7 | 8 | 9 | 10 |
| Radically polymerizable compound (a) | Divinylbenzene | — | — | — | — | 97 |
| | FA-513AS | — | — | — | — | — |
| | CD406 | — | — | — | — | — |
| | SR833 | — | 97 | 97 | 97 | — |
| | DCP | 97 | — | — | — | — |
| Hygroscopic compound (b) | ALCH | — | — | — | — | — |
| | Algomaer | — | 1 | — | — | — |
| | Algomaer 1000SF | — | — | 1 | — | — |
| | Algomaer 600AF | — | — | — | 1 | — |
| | Algomaer 800AF | 1 | — | — | — | 2 |
| Polymerization initiator (c) | Esacure-TZT | 1 | 1 | 1 | 1 | 1 |
| | V-601 | — | — | — | — | — |
| Solvent (d) | Hexane | — | — | — | — | — |
| | Butanol | — | — | — | — | — |
| | AF-7 solvent | 1 | 1 | 1 | 1 | — |
| Total | (mass %) | 100 | 100 | 100 | 100 | 100 |
| | Calcium corrosion test | A | A | A | A | C |
| | Storage stability | 7 days or more | 7 days or more | 7 days or more | 7 days or more | 7 days or more |
| Reference characteristic | Compatibility before cured | A | A | A | A | A |
| | Compatibility after cured | A | A | A | A | A |
| | Viscosity | A | A | A | A | A |
| | Outgas | A | A | A | A | C |
| | Water vapor barrier test | 30 | 13 | 20 | 14 | 40 |

It was found that, as shown in Table 1, Examples 1 to 10 each received a high evaluation in the calcium corrosion test and therefore a cured film of the sealing resin composition of the present invention had a high sealing property. Further, each of these sealing resin compositions had high storage stability. In addition, each of the sealing resin compositions exhibited a sealing property without having to make an interior of the room drying in particular and was excellent in handling. Further, each of resin viscosities was low enough to conduct a sealing work. Examples 2 to 9 each of which used a solvent (d) having a boiling point of 100° C. or more, were also excellent in outgassing property. In addition, in Examples 1, 3 to 10, both compatibility (before cured) and compatibility (after cured) are higher, from which it is believed that the sealing resin compositions were uniformly cured. From this result, it is understood that the sealing resin compositions of the present invention can be used for sealing, for example, an organic light-emitting element 3 of the organic light-emitting device shown in FIG. 1.

In contrast, in Comparative Example 1 using ALCH as a hygroscopic compound having no structure of Formula (1), at the moment of the calcium corrosion test, the peeling from the sealing interface occurred, and the calcium corrosion test was impossible to perform. Comparative Example 2 without a hygroscopic compound (b) got a poor evaluation in the calcium corrosion test. Comparative Example 3 using a heat radical polymerization initiator was inferior in terms of storage stability.

Having described our invention as related to the present embodiments, it is our intention that the invention not be limited by any of the details of the description, unless otherwise specified, but rather be construed broadly within its spirit and scope as set out in the accompanying claims.

REFERENCE SIGNS LIST

1 Sealing substrate
2 Resin cured material
3 Organic light-emitting element
4 Element substrate
b Spacer (filler)
5, 5A Organic light-emitting device (image display device)
10 Side-surface sealing structure
11 Sealing substrate 12 Resin cured material
13 Organic light-emitting element
14 Element substrate
15 Organic light-emitting device (image display device)
21 Inorganic thin film
22 Organic thin film (resin cured material)
23 Organic light-emitting element
24 Element substrate
15 Organic light-emitting device (image display device)
51 Resin cured material
52 Metal calcium layer
54 Metal calcium layer after test
R Curvature radius

The invention claimed is:

1. A curable and hygroscopic resin composition for sealing electronic devices, comprising:
   a radically polymerizable compound (a);
   a hygroscopic compound (b) containing a structure represented by Formula (1); and
   a photo-radical polymerization initiator (c):

Formula (1)

wherein in Formula (1), R designates (i) an acyl group, (ii) a hydrocarbon group, or (iii) a group having at least one selected from the group consisting of —O—, —S—, —CO—, and —NH—, between a carbon-carbon bond of the above-described hydrocarbon group; provided that, a part of hydrogen atoms, which the forgoing groups (i), (ii) and (iii) each have, may be substituted with a hydroxyl group, a halogen atom or a cyano group; M designates a boron atom or an aluminum atom; n is an integer of 2 to 20; plural Ws and M's may be the same or different from each other, respectively; and *1 and *2 each designate a binding site to a terminal group or are bonded to each other.

2. The curable and hygroscopic resin composition for sealing electronic devices described in claim 1, wherein the radically polymerizable compound (a) is a (meth)acrylate compound.

3. The curable and hygroscopic resin composition for sealing electronic devices described in claim 1, wherein the radically polymerizable compound (a) has one or more alicyclic skeletons.

4. The curable and hygroscopic resin composition for sealing electronic devices described in claim 3, wherein the alicyclic skeleton is at least one of a tricyclodecane skeleton and a hydrogenated bisphenol A skeleton.

5. The curable and hygroscopic resin composition for sealing electronic devices described in claim 1, comprising a solvent (d), wherein the boiling point of the solvent (d) is 100° C. or more.

6. The curable and hygroscopic resin composition for sealing electronic devices described in claim 5, wherein the boiling point of the solvent (d) is 160° C. or more.

7. The curable and hygroscopic resin composition for sealing electronic devices described in claim 5, wherein the boiling point of the solvent (d) is 240° C. or more.

8. The curable and hygroscopic resin composition for sealing electronic devices described in claim 5, wherein the solvent (d) is a naphthene-series solvent or an isoparaffin-series solvent.

9. The curable and hygroscopic resin composition for sealing electronic devices described in claim 5, wherein the ratio d/b of the content of the solvent (d) to the content of the hygroscopic compound (b) is 2 or less.

10. The curable and hygroscopic resin composition for sealing electronic devices described in claim 1, wherein the hygroscopic compound (b) is represented by Formula (2):

Formula (2)

wherein, in Formula (2), $R^1$ has the same meaning as R in Formula (1).

11. The curable and hygroscopic resin composition for sealing electronic devices described in claim 1, wherein the hygroscopic compound (b) is contained in an amount of 0.1 mass % or more and 50 mass % or less, in 100 mass % of the curable and hygroscopic resin composition.

12. The curable and hygroscopic resin composition for sealing electronic devices described in claim 2, wherein the radically polymerizable compound (a) has one or more alicyclic skeletons.

* * * * *